United States Patent
Miyazawa

(10) Patent No.: US 12,160,228 B2
(45) Date of Patent: Dec. 3, 2024

(54) SEMICONDUCTOR MODULE

(71) Applicant: FUJI ELECTRIC CO., LTD., Kawasaki (JP)

(72) Inventor: Shigemi Miyazawa, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 206 days.

(21) Appl. No.: 17/846,739

(22) Filed: Jun. 22, 2022

(65) Prior Publication Data

US 2023/0053720 A1 Feb. 23, 2023

(30) Foreign Application Priority Data

Aug. 17, 2021 (JP) .................................. 2021-132701

(51) Int. Cl.
| | |
|---|---|
| *H03K 17/0812* | (2006.01) |
| *H02H 3/093* | (2006.01) |
| *H02M 1/32* | (2007.01) |
| *H02M 3/158* | (2006.01) |

(52) U.S. Cl.
CPC ....... *H03K 17/08122* (2013.01); *H02H 3/093* (2013.01); *H02M 1/32* (2013.01); *H02M 3/158* (2013.01); *H03K 2217/0027* (2013.01)

(58) Field of Classification Search
CPC .... H03K 17/08122; H02H 3/093; H02M 1/32
See application file for complete search history.

(56) References Cited

U.S. PATENT DOCUMENTS

| | | | |
|---|---|---|---|
| 7,218,496 B2* | 5/2007 | Kitagawa ............... | H02H 3/087 361/96 |
| 2003/0210917 A1* | 11/2003 | Stewart .............. | H04B 10/6931 398/209 |

FOREIGN PATENT DOCUMENTS

JP H08-316807 A 11/1996

* cited by examiner

*Primary Examiner* — Scott Bauer

(74) *Attorney, Agent, or Firm* — Rabin & Berdo, P.C.

(57) ABSTRACT

A semiconductor module including a first switching device coupled to a first line, a terminal, at which a first voltage corresponding to a first current flowing through the first switching device is generated, coupled to the first switching device, a second switching device coupled to the first line for allowing a second current corresponding to the first current to flow therethrough, a voltage generation circuit configured to apply, to a second line, a second voltage lower than a power supply voltage, a resistor, across which a third voltage corresponding to the second current is generated, coupled between the second switching device and the terminal, a reference voltage circuit coupled to the terminal for generating a fourth voltage, and a comparator circuit coupled between the first and second lines, for determining whether the first switching device is in an overcurrent state based on a comparison between the third and fourth voltages.

7 Claims, 12 Drawing Sheets

| | DURING NORMAL OPERATION $\begin{pmatrix} Vsns < Vref, \\ Vout > Vgnd \end{pmatrix}$ | DURING OVERCURRENT DETECTION $\begin{pmatrix} Vsns > Vref, \\ Vout > Vgnd \end{pmatrix}$ | OUTSIDE COMMON MODE INPUT RANGE ( Vout < Vgnd ) |
|---|---|---|---|
| Vcmp | Hi | Lo | Lo |

FIG. 6B

|  | DURING NORMAL OPERATION $\begin{pmatrix} Vsns < Vref, \\ Vout > Vgnd \end{pmatrix}$ | DURING OVERCURRENT DETECTION $\begin{pmatrix} Vsns > Vref, \\ Vout > Vgnd \end{pmatrix}$ | OUTSIDE COMMON MODE INPUT RANGE $(Vout < Vgnd)$ |
|---|---|---|---|
| Vcmp | Lo | Hi | Lo |
| Vinv | Lo | Lo | Hi |
| Vlg | Lo | Hi | Hi |

FIG. 9B

SEMICONDUCTOR MODULE

CROSS-REFERENCE TO RELATED APPLICATION

The present application claims priority pursuant to 35 U.S.C. § 119 from Japanese patent application number 2021-132701 filed on Aug. 17, 2021, the entire disclosure of which is hereby incorporated by reference herein.

BACKGROUND

Technical Field

The present disclosure relates to a semiconductor module.

Description of the Related Art

An intelligent power switch (IPS) having an overcurrent detection function (see Japanese Patent Application Publication No. H8-316807, for example) is known.

Generally, such an IPS includes a comparator circuit to detect whether a switching device is brought about an overcurrent state. Incidentally, when the switching device has been brought about an overcurrent state due to a short-circuit of a load or the like, for example, the voltages input to the comparator circuit may fall outside a common mode input range, and the comparator circuit may not be able to detect the overcurrent state.

SUMMARY

A first aspect of an embodiment of the present disclosure is a semiconductor module comprising: a first switching device coupled to a first line in the semiconductor module, the first line being configured to receive a power supply voltage; a terminal coupled to the first switching device, a first voltage corresponding to a first current flowing through the first switching device being generated at the terminal while the first switching device is on; a second switching device coupled to the first line, the second switching device being configured to allow a second current corresponding to the first current to flow therethrough; a voltage generation circuit configured to apply, to a second line in the semiconductor module, a second voltage that is lower than the power supply voltage by a predetermined voltage; a resistor coupled between the second switching device and the terminal, a third voltage corresponding to the second current being generated across the resistor; a reference voltage circuit coupled to the terminal, the reference voltage circuit being configured to generate a fourth voltage; and a comparator circuit coupled between the first line and the second line, the comparator circuit being configured to determine whether the first switching device is in an overcurrent state based on a comparison between the third voltage and the fourth voltage.

Note that not all of the necessary features of the present disclosure are listed in the above summary. Moreover, sub-combinations of these features can be the disclosure as well.

BRIEF DESCRIPTION OF THE DRAWINGS

FIG. 6B illustrates an example of a voltage Vcmp output from a comparator circuit 27 in operating states of the comparator circuit 27.

FIG. 9B illustrates an example of a voltage Vcmp output from a comparator circuit 27 in operating states of the comparator circuit 27.

DETAILED DESCRIPTION

Hereinafter, the present disclosure will be described through embodiments of the disclosure. However, the following embodiments do not limit the disclosure according to the scope of the claims. Also, not all the combinations of the features described in the embodiments are necessarily essentials for solution in the disclosure.

Herein, when the term "couple" is used, it means to "electrically couple" unless otherwise noted. Herein, a state where the logic level of a voltage or a signal is a low (Lo) level will be referred to as "low or low level", and a state where the logic level is a high (Hi) level will be referred to as "high or high level".

Herein, one side in a direction parallel to the depth direction of a semiconductor module will be referred to as "front", while the other side will be referred to as "back". Here, the directions such as "front" and "back" are not limited to the direction of gravity or the directions in which members are mounted to a substrate or the like at the time of mounting the semiconductor module.

Herein, a ground potential is a reference potential obtained by a configuration of an entire system including the semiconductor module, and is 0 V.

Embodiment 1

<<Overview of Semiconductor Module 10>>

Figure 1:
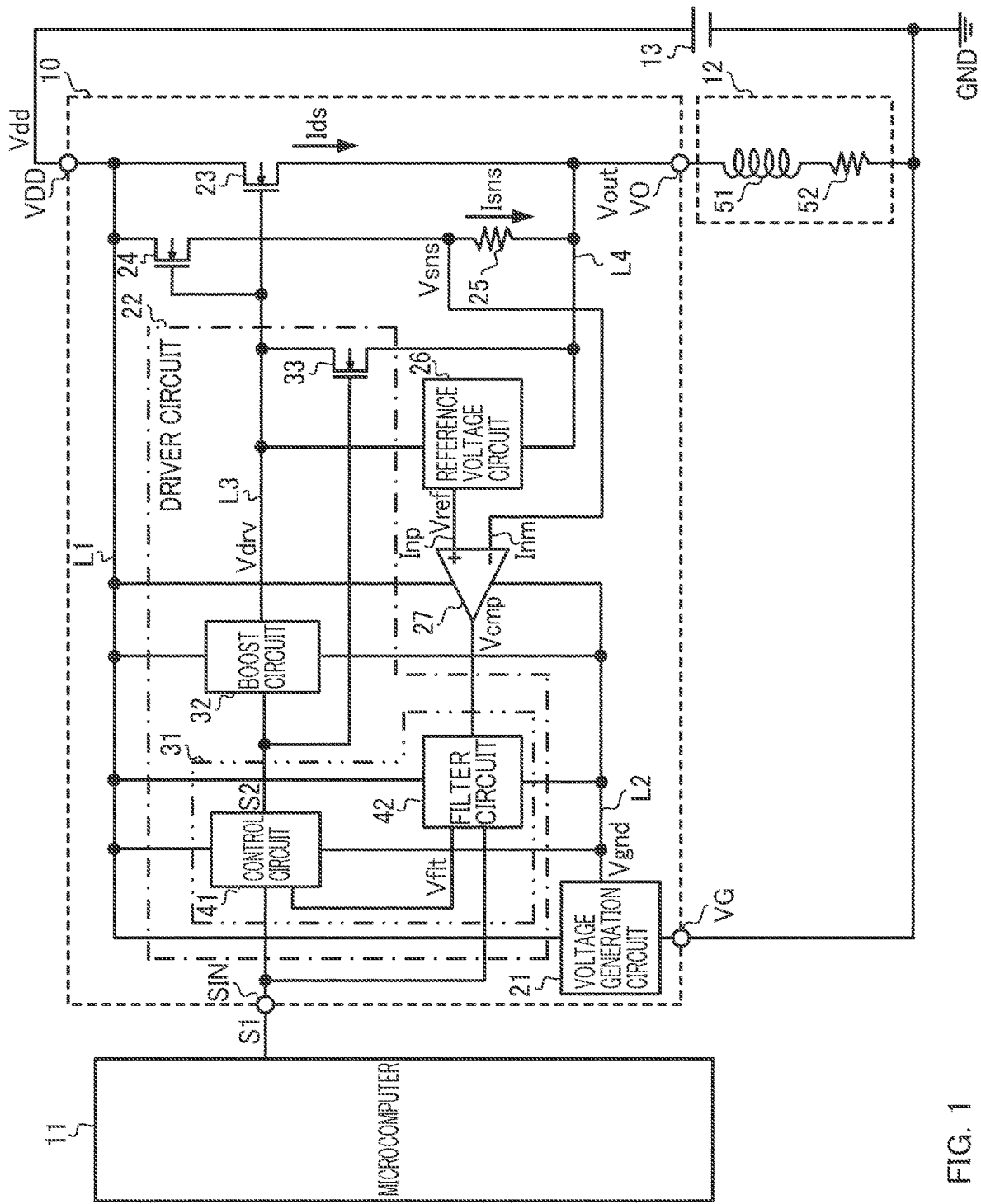
FIG. 1 illustrates an example of a configuration of a semiconductor module 10.

FIG. 1 schematically illustrates a configuration of a semiconductor module 10. The semiconductor module 10 is an intelligent power switch (IPS) that drives a load 12 in response to a signal Sin from a microcomputer 11, with a power supply 13 that supplies a power supply voltage Vdd. The semiconductor module 10 is provided on a side closer to the power supply 13, in other words, a high side, with respect to the load 12.

The microcomputer 11 is coupled to a terminal SIN of the semiconductor module 10 and inputs a signal S1 thereto. As an example, the microcomputer 11 is a device included in an electronic control unit (ECU) of an automobile.

As an example, the load 12 is a solenoid valve used in a transmission system of an automatic transmission automobile. The solenoid valve includes a solenoid constituting an electromagnet and a valve (not illustrated). The valve is closed when the solenoid is electrically connected, and the valve is open when the solenoid is not electrically connected. Here, the load 12 includes an inductor 51 and a resistor 52.

As an example, the inductor 51 is the solenoid of a solenoid valve. The resistor 52 adjusts a voltage applied to the inductor 51. The resistor 52 is provided between the inductor 51 and the ground.

The power supply 13 applies the power supply voltage Vdd to a terminal VDD. The terminal VDD is coupled to a line L1, and the power supply voltage Vdd is applied to the line L1. As an example, the power supply 13 is a battery of an automobile.

<<Example Configuration of Semiconductor Module 10>>

Here, the semiconductor module 10 includes a voltage generation circuit 21, a driver circuit 22, switching devices 23 and 24, a resistor 25, a reference voltage circuit 26, and a comparator circuit 27.

<<Voltage Generation Circuit 21>>

The voltage generation circuit 21 generates a voltage Vgnd serving as a voltage on the ground side of a control circuit 41, which will be described later, and the like, and applies the voltage Vgnd to a line L2. The voltage Vgnd is a voltage lower than the power supply voltage Vdd by a predetermined voltage (e.g., 5 V). The voltage generation circuit 21 is provided between the line L1 that receives the power supply voltage Vdd, and a terminal VG that is grounded.

<<Overview of Driver Circuit 22>>

The driver circuit 22 turns on and off the switching device 23 in response to the signal S1 that is input from the microcomputer. Specifically, the driver circuit 22 applies a voltage Vdrv to a line L3, to thereby turn on the switching device 23 that is coupled to the line L3. On the other hand, the driver circuit 22 turns on an interrupting device 33, to thereby turn off the switching device 23.

In particular, as will be described later, the driver circuit 22 performs an operation of protecting the switching device 23, in response to the comparator circuit 27 determining that the switching device 23 is in an overcurrent state. The driver circuit 22 according to an embodiment of the present disclosure turns off the switching device 23, in response to the comparator circuit 27 determining that the switching device 23 is in an overcurrent state.

===Details of Driver Circuit 22===

Here, the driver circuit 22 includes a control signal output circuit 31, a boost circuit 32, and the interrupting device 33.

===Control Signal Output Circuit 31===

The control signal output circuit 31 outputs a signal S2, which is a control signal, to the boost circuit 32 in response to the signal S1 from the microcomputer 11 and a voltage Vcmp from the comparator circuit 27. The control signal output circuit 31 according to an embodiment of the present disclosure includes the control circuit 41 and a filter circuit 42.

===Control Circuit 41===

The control circuit 41 outputs the signal S2, based on the signal S1 that is input from the microcomputer 11 through the terminal SIN and a voltage Vflt that is input from the filter circuit 42.

According to an embodiment of the present disclosure, the control circuit 41 outputs a high signal S2 when the voltage Vflt input from the filter circuit 42 is high and the signal S1 is low. On the other hand, the control circuit 41 outputs a low signal S2 when the voltage Vflt input from the filter circuit 42 is high and the signal S1 is high.

The control circuit 41 according to an embodiment of the present disclosure also outputs the high signal S2 when the voltage Vflt input from the filter circuit is low.

===Filter Circuit 42===

The filter circuit 42 masks the operation of the control circuit 41 in a predetermined time period Tflt (e.g., 10 μsec) when the switching device 23 is turned on. Here, the "predetermined time period Tflt when the switching device 23 is turned on" refers to the time period from when the signal S1 for turning on the switching device 23 is input to the filter circuit 42 until when the time period Tflt has elapsed.

Specifically, before the time period Tflt, the filter circuit 42 outputs the high voltage Vflt to the control circuit 41 in response to the low signal S1 input thereto. During the time period Tflt, the filter circuit 42 outputs the high voltage Vflt to the control circuit 41 irrespective of the result of the comparison by the comparator circuit 27, which will be described later. In this case, the control circuit 41 outputs the signal S2 in response to the signal S1. After a lapse of the time period Tflt, the control circuit 41 outputs the signal S2 in response to the signal S1 and the result of the comparison by the comparator circuit 27, which will be described later.

Incidentally, as will be described later in detail, the comparator circuit 27 may instantaneously indicate a logic level representing that the switching device 23 is in an overcurrent state in a time period from when the signal S1 is input to the control circuit 41 to when circuits in the semiconductor module 10 stabilize (e.g., several μsec). The filter circuit 42 masks the result of the comparison by the comparator circuit 27, thereby being able to stably drive the circuits.

Further, the filter circuit 42 according to an embodiment of the present disclosure is coupled to the terminal SIN. Thus, the signal S1 is input to the filter circuit 42, which enables the filter circuit 42 to detect the timing at which the control circuit 41 starts its operation to turn on the switching device 23.

===Boost Circuit 32===

When turning on the switching device 23, the boost circuit 32 generates the driving voltage Vdrv by boosting the power supply voltage Vdd input thereto in the case where the signal S2 input from the control circuit 41 is low. Further, the boost circuit 32 applies the driving voltage Vdrv to a control electrode of the switching device 23. The switching device 23 is turned on by the driving voltage Vdrv.

On the other hand, in the case where the signal S2 is high, the boost circuit 32 stops generating the driving voltage Vdrv. The boost circuit 32 is a charge pump circuit as an example.

===Interrupting Device 33===

The interrupting device 33 turns off the switching device 23 in response to the signal S2 from the control circuit 41. The interrupting device 33 according to an embodiment of the present disclosure is a metal-oxide-semiconductor (MOS) transistor. However, the interrupting device 33 may be other switching devices.

According to an embodiment of the present disclosure, firstly, upon receiving the low signal S1 for turning off the switching device 23 from the microcomputer 11, the control circuit 41 outputs the high signal S2. Upon receiving the high signal S2, the boost circuit 32 stops generating the driving voltage Vdrv, to thereby turn on the interrupting device 33. Accordingly, the interrupting device 33 lowers the voltage applied to the control electrode of the switching device 23 through the line L3, to thereby turn off the switching device 23.

On the other hand, upon receiving the high signal S1 for turning on the switching device 23 from the microcomputer 11, the control circuit 41 outputs the low signal S2. Upon receiving the low signal S2, the boost circuit 32 starts generating the driving voltage Vdrv, to thereby turn off the interrupting device 33. Accordingly, the interrupting device 33 stops lowering the voltage of the line L3, which raise the voltage applied to the control electrode of the switching device 23, to thereby turn on the switching device 23.

<<Details of Switching Device 23>>

The switching device 23 switches the voltage to be applied to the load 12 from the power supply 13. The switching device 23 is, for example, a high-withstand voltage switching device.

The switching device 23 according to an embodiment of the present disclosure is an N-type MOS transistor with a vertical trench structure (VMOS transistor) having a drain electrode formed at the back surface of a substrate and a source electrode formed at the front surface thereof. The switching device 23 according to an embodiment of the present disclosure is a power semiconductor device having a withstand voltage of several tens of V (e.g., having an on-resistance of 100 mΩ).

However, the switching device 23 is not limited to a VMOS transistor and may be a planar MOS transistor or a bipolar device such as an insulated gate bipolar transistor (IGBT).

The control electrode of the switching device 23 is coupled to the line L3. As an example, the control electrode is a gate electrode when the switching device 23 is a MOS transistor or an IGBT, and the control electrode is a base terminal when the switching device 23 is a bipolar transistor.

The switching device 23 has a drain electrode coupled to the line L1, and a source electrode coupled to a terminal VO. Note that when the switching device 23 is an IGBT or a bipolar transistor, its collector electrode and emitter electrode correspond to the drain electrode and source electrode.

The terminal VO is a terminal to which the load 12 is coupled and at which a voltage Vout to be applied to the load 12 is generated. The voltage Vout generated at the terminal VO is a voltage corresponding to the on-resistance of the switching device 23 and a current Ids flowing through the switching device 23 when the switching device 23 is on.

<<Switching Device 24>>

The switching device 24 is a device allowing a current Isns corresponding to the current Ids flowing through the switching device 23 to flow therethrough. The switching device 24 is structurally similar to the switching device 23. As an example, the switching device 24 provided is a power semiconductor device having an electrical conductivity lower than that of the switching device 23 (e.g., a current Isns, which is 0.25% of the current Ids, flows therethrough).

For example, the switching device 24 is a sense MOS transistor in the case where the switching device 23 is a MOS transistor, and is a sense IGBT in the case where the switching device 24 is an IGBT.

The gate electrode of the switching device 24 and the gate electrode of the switching device 23 are coupled in parallel with the line L3. The drain and source electrodes of the switching device 24 are coupled to the line L1 and the resistor 25, respectively.

<<Resistor 25>>

The resistor 25 is a resistor (e.g., 20Ω) for detecting that the switching device 23 is in an overcurrent state. A voltage Vsns corresponding to the current Isns is generated across the resistor 25. The resistor 25 is coupled between the switching device 24 and the terminal VO.

<<Reference Voltage Circuit 26>>

The reference voltage circuit 26 generates a predetermined reference voltage Vref serving as a reference for the comparator circuit 27 to detect an overcurrent, and applies the reference voltage Vref to a line Inp coupled to the non-inverting input terminal of the comparator circuit 27. The reference voltage circuit 26 according to an embodiment of the present disclosure is coupled to the line L3 that receives the voltage Vdrv boosted by the boost circuit 32, and to a line L4 coupled to the terminal VO.

The reference voltage Vref is set as a voltage with a certain potential difference (e.g., 100 mV) with respect to the voltage Vout generated at the terminal VO. For example, in the case where an overcurrent is detected when the resistor 25 has 20Ω and the current Ids flowing through the switching device 23 is 2 A, and the current Isns under this condition is 5 mA, the reference voltage Vref is set to Vref=20×0.005 (V)=100 (mV).

<<Comparator Circuit 27>>

The comparator circuit 27 compares the voltage Vsns generated across the resistor 25 and the reference voltage Vref generated by the reference voltage circuit 26, to determine whether the switching device 23 is in an overcurrent state. The comparator circuit 27 outputs the voltage Vcmp at a logic level that varies depending on the result of the determination.

According to an embodiment of the present disclosure, the voltage Vcmp is input to the filter circuit 42. According to an embodiment of the present disclosure, the filter circuit 42 supplies the voltage Vflt to the control circuit 41 according to the voltage Vcmp.

Specifically, the voltage Vflt is at a logic level indicating that the switching device 23 is not in an overcurrent state irrespective of the voltage Vcmp in a time period from when the signal S1 goes high until the time period Tflt has elapsed, and is at the same logic level as that of the voltage Vcmp input from the comparator circuit 27 after a lapse of the time period Tflt.

According to an embodiment of the present disclosure, the comparator circuit 27 is coupled to the control circuit 41 through the filter circuit 42. Thus, by operating based on the voltage Vflt, the control circuit 41 can operate indirectly based on the voltage Vcmp without coupling the comparator circuit 27 to the control circuit 41.

The reference voltage Vref is applied to the line Inp coupled to the non-inverting input terminal of the comparator circuit 27, and the voltage Vsns is applied to a line Inm coupled to the inverting input terminal of the comparator circuit 27. The voltages applied to the lines Inp and Inm are both low, during a time period before the switching devices 23 and 24 are turned on during which the signal S1 is low. In this case, the comparator circuit 27 according to an embodiment of the present disclosure outputs a low voltage Vcmp to the filter circuit 42. Further, the comparator circuit 27 is coupled to the lines L1 and L2, to thereby use a voltage of the difference between the power supply voltage Vdd and the voltage Vgnd as a bias voltage.

====Embodiment in which Comparator Circuit 27 has Modified Coupling Relationship====

In another embodiment of the semiconductor module 10, the comparator circuit 27 is coupled to the control circuit 41 without the filter circuit 42 interposed therebetween. In particular, in an embodiment in which the control circuit 41 is separately coupled to the comparator circuit 27 and to the filter circuit 42, the control circuit 41 uses the high voltage Vflt output by the filter circuit 42 in priority to the voltage Vcmp output by the comparator circuit 27 and, when the voltage Vflt is high, outputs the signal S2 in response to the signal S1 irrespective of the logic level of the voltage Vcmp.

Note that, in the semiconductor module 10, the line L1 corresponds to a "first line". The switching device 23 corresponds to a "first switching device". The current Ids flowing through the switching device 23 corresponds to a "first current", and the voltage Vout corresponds to a "first voltage".

The switching device 24 corresponds to a "second switching device", and the current Isns corresponds to a "second current".

The voltage Vgnd corresponds to a "second voltage", and the line L2 corresponds to a "second line".

The signal S1 corresponds to an "input signal". The voltage Vsns corresponds to a "third voltage", and the reference voltage Vref corresponds to a "fourth voltage".

<<Configuration of Reference Voltage Circuit 26>>

Figure 2:
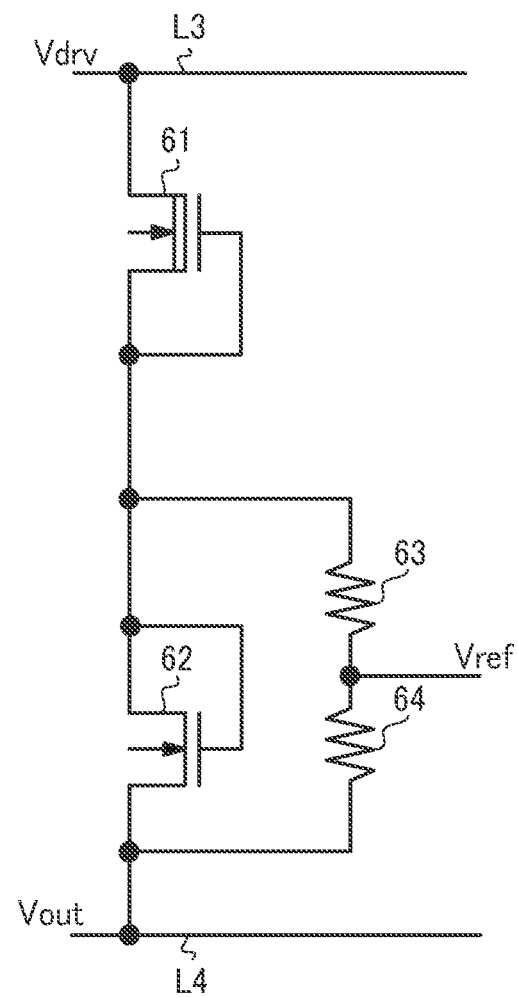
FIG. 2 illustrates an example of a configuration of a reference voltage circuit 26.

FIG. 2 illustrates an example of a configuration of the reference voltage circuit 26. The reference voltage circuit 26 includes a depletion type MOS transistor 61, a MOS transistor 62, and resistors 63 and 64.

The gate electrode and source electrode of the depletion type MOS transistor 61 are coupled, and the gate electrode and drain electrode of the MOS transistor 62 are coupled. Also, the depletion type MOS transistor 61 and the MOS transistor 62 are N-type MOS transistors.

The depletion type MOS transistor 61 is a high-withstand voltage MOS transistor. Thus, the depletion type MOS transistor 61 can stably operate even when the voltage Vdrv output from the boost circuit 32 fluctuates. The drain electrode of the depletion type MOS transistor 61 is coupled to the line L3 that receives the voltage Vdrv from the boost circuit 32.

The MOS transistor 62 and the resistor 63 are coupled to the source electrode of the depletion type MOS transistor 61. A current supplied from the depletion type MOS transistor 61 is dependent on the threshold voltage of the MOS transistor 62. Thus, a predetermined bias voltage dependent on the threshold voltage of the MOS transistor 62 is supplied to the resistor 63 and the resistor 64.

The MOS transistor 62 functions as a bias voltage source to generate the bias voltage. The MOS transistor 62 is provided between the depletion type MOS transistor 61 and the line L4 that receives the voltage Vout.

The resistor 63 divides, with the resistor 64, the bias voltage supplied from the depletion type MOS transistor 61, to supply the reference voltage Vref serving as a reference voltage for detecting an overcurrent. The resistor 63 has one end coupled to the drain electrode of the MOS transistor 62, and the other end coupled to the resistor 64, and a voltage generated between the resistor 64 and the line L4 is to be supplied as the reference voltage Vref.

The resistor 64 is provided between the resistor 63 and the line L4. The resistor 64 has one end coupled to the resistor 63, and the other end coupled to the line L4.

<<Configuration of Comparator Circuit 27>>

Figure 3A:
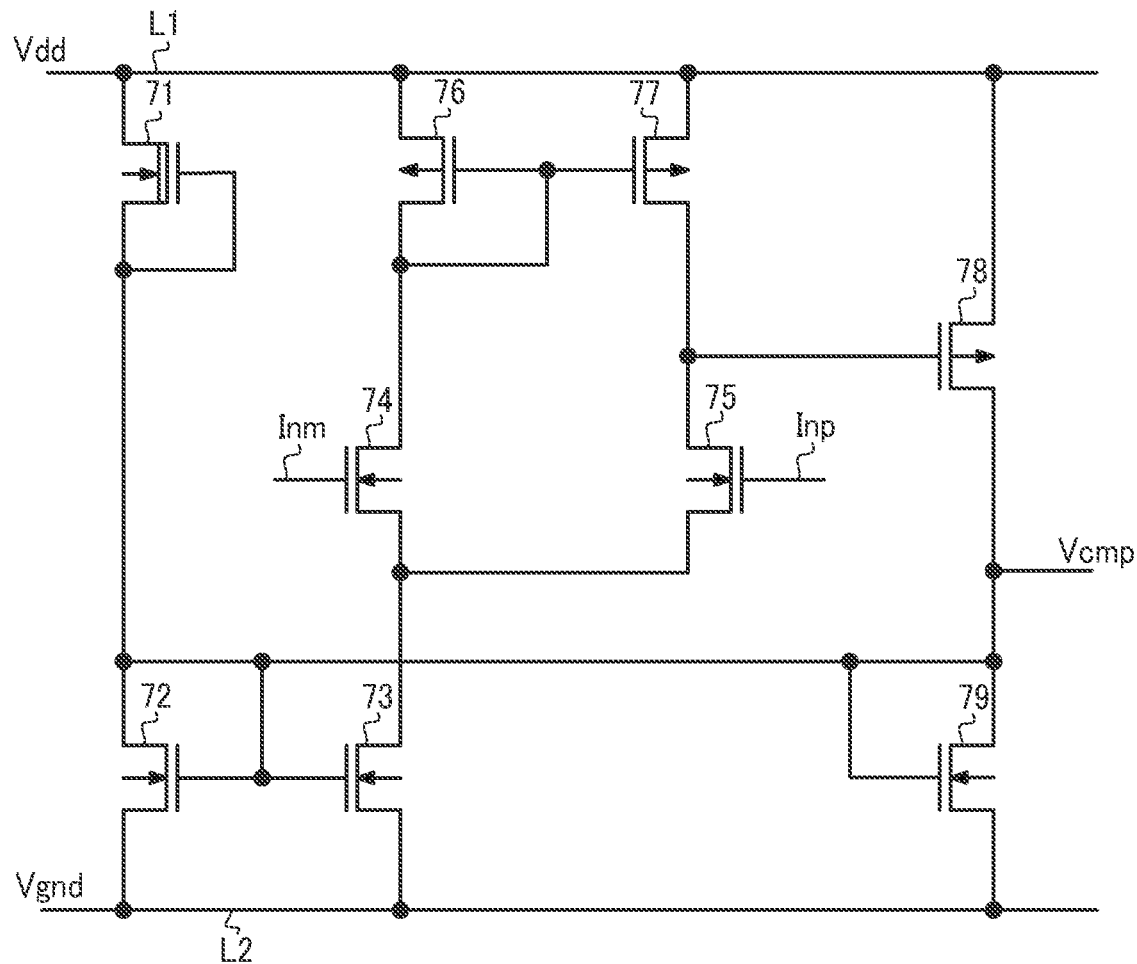
FIG. 3A illustrates an example of a configuration of a comparator circuit 27.

FIG. 3A illustrates an example of a configuration of the comparator circuit 27. The comparator circuit 27 includes a depletion type MOS transistor 71 and MOS transistors 72 to 79. The MOS transistors 76, 77, and 78 are P-type MOS transistors while the MOS transistor 72 to 75 and 79 are N-type MOS transistors. Further, the depletion type MOS transistor 71 is an N-type MOS transistor.

The depletion type MOS transistor 71 and the MOS transistor 72 configure a bias current source to cause the MOS transistors 73 and 79 to operate.

The gate electrode of the MOS transistor 72 is coupled to the drain electrode of the MOS transistor 72. Further, the gate electrodes of the MOS transistors 73 and 79 are coupled in parallel to the gate electrode of the MOS transistor 72. Thus, the MOS transistors 72, 73, and 79 configure a current mirror circuit.

The MOS transistor 73 configures a current mirror circuit with the MOS transistor 72, and thus the MOS transistor 73 functions as a current source passing a drain-source current corresponding to the bias current, the current source being configured with the depletion type MOS transistor 71 and the MOS transistor 72.

The MOS transistors 74 and 75 configure a differential pair where the drain-source current of the MOS transistor 73 serves as a tail current.

Since each of the MOS transistors 74 and 75 is an N-type transistor, the comparator circuit 27 operates accurately when the voltages input to the lines Inp and Inm are close to the voltage Vdd. On the other hand, when the voltages input to the lines Inp and Inm are lower than the threshold voltage of the MOS transistors 74 and 75, the comparator circuit 27 may fail to operate.

The MOS transistors 76 and 77 configure a current mirror circuit. Thus, currents flowing from the MOS transistors 76 and 77 to the MOS transistors 74 and 75 are adjusted.

The currents flowing through the MOS transistors 74 and 75 differ according to the voltages applied to the differential pair, and thus the voltage to be applied to the MOS transistor 78 varies.

The MOS transistors 78 and 79 configure the output stage of the comparator circuit 27. Since the MOS transistor 79 configures a current mirror circuit with the MOS transistors 72 and 73, the current flowing through the MOS transistor 79 is equal to those flowing through the MOS transistors 72 and 73.

The voltage applied to the gate electrode of the MOS transistor 78 varies with the voltages applied to the gate electrodes of the differential pair. This causes the voltage Vcmp to vary, to thereby cause the comparator circuit 27 to function.

<<Input Voltages Input to Comparator Circuit 27>>

Figure 3B:
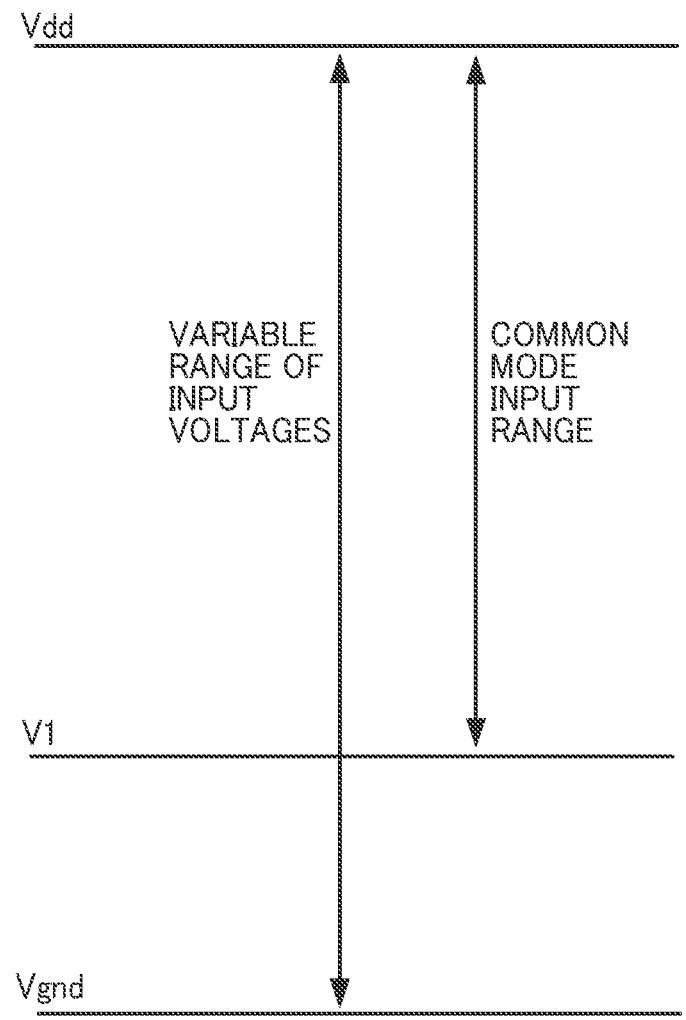
FIG. 3B illustrates an example of a variable range of input voltages input to a comparator circuit 27 and its common mode input range.

FIG. 3B illustrates an example of the variable range of input voltages input to the comparator circuit 27 and its common mode input range.

The MOS transistors 74 and 75 configuring the differential pair coupled to the input lines Inp and Inm of the comparator circuit 27, respectively, are N-type MOS transistors. Thus, the comparator circuit 27 does not operate as a comparator circuit, when the voltages input thereto become equal to or drop below a predetermined voltage V1.

The resistor 25 in FIG. 1 is coupled to the terminal VO, and the reference voltage circuit 26 is provided between the lines L3 and L4. That is, the resistor 25 and the reference voltage circuit 26 are both coupled to the terminal VO.

Accordingly, in response to the voltage Vout generated at the terminal VO dropping below the voltage Vgnd, both the voltage Vsns and the reference voltage Vref drop. In this case, both the voltages to be input to the comparator circuit 27 through the lines Inp and Inm drop.

In a range of voltage V1<voltage Vout<power supply voltage Vdd, the comparator circuit 27 is in its common mode input range. In this case, the comparator circuit 27 can output a voltage Vcmp having a logic level corresponding to the voltages applied to the lines Inp and Inm. On the other hand, in the case of voltage Vout<voltage V1, the comparator circuit 27 is in a non-common mode input range and may fail to operate.

Cases where the load 12 is brought about an overcurrent state include: (i) an overcurrent flows through the load 12; and (ii) a path parallel to the load 12 is short-circuited between the terminal VO and the ground due to a circuit defect, dirt, and/or the like, resulting in an overcurrent flowing in the direction of the ground through a path other than the load 12.

In the case (i), the comparator circuit 27 operates in the common mode input range without a drop in the voltage Vout to be applied to the terminal VO. Accordingly, it is detected that the voltage Vsns exceeds the reference voltage Vref, and the voltage Vcmp at a logic level indicating an overcurrent state is output. Thus, the driver circuit 22 can perform an operation of interrupting the switching device 23, or the like, and the circuit is protected from an overcurrent appropriately.

On the other hand, in the case (ii), a state of voltage Vout<voltage V1 may be brought about, which may cause the comparator circuit 27 to fail to operate. The comparator circuit according to an embodiment of the present disclosure is so coupled as to output the voltage Vcmp at a logic level as will be described later with reference to FIG. 6B, and the like. Thus, even in such a case as well, it can be determined that the switching device 23 is in an overcurrent state.

Further, the comparator circuit 27 according to an embodiment of the present disclosure includes no differential pair of P-type MOS transistors. That is, even in the case (ii), the semiconductor module 10 is capable of determining whether there is an overcurrent without using a device having a large circuit area, such as a rail-to-rail input comparator. Accordingly, the semiconductor module 10 according to an embodiment of the present disclosure contributes to reduction in the circuit area as well.

As such, in the semiconductor module 10, the voltages Vsns and Vref are input to the comparator circuit 27. This makes it possible to protect the circuit from the overcurrent state of the switching device 23 when the voltage Vout drops below the voltage Vgnd, without inputting the voltage Vout to the comparator circuit 27.

<<Timing Chart During Normal Operation>>

Figure 4:
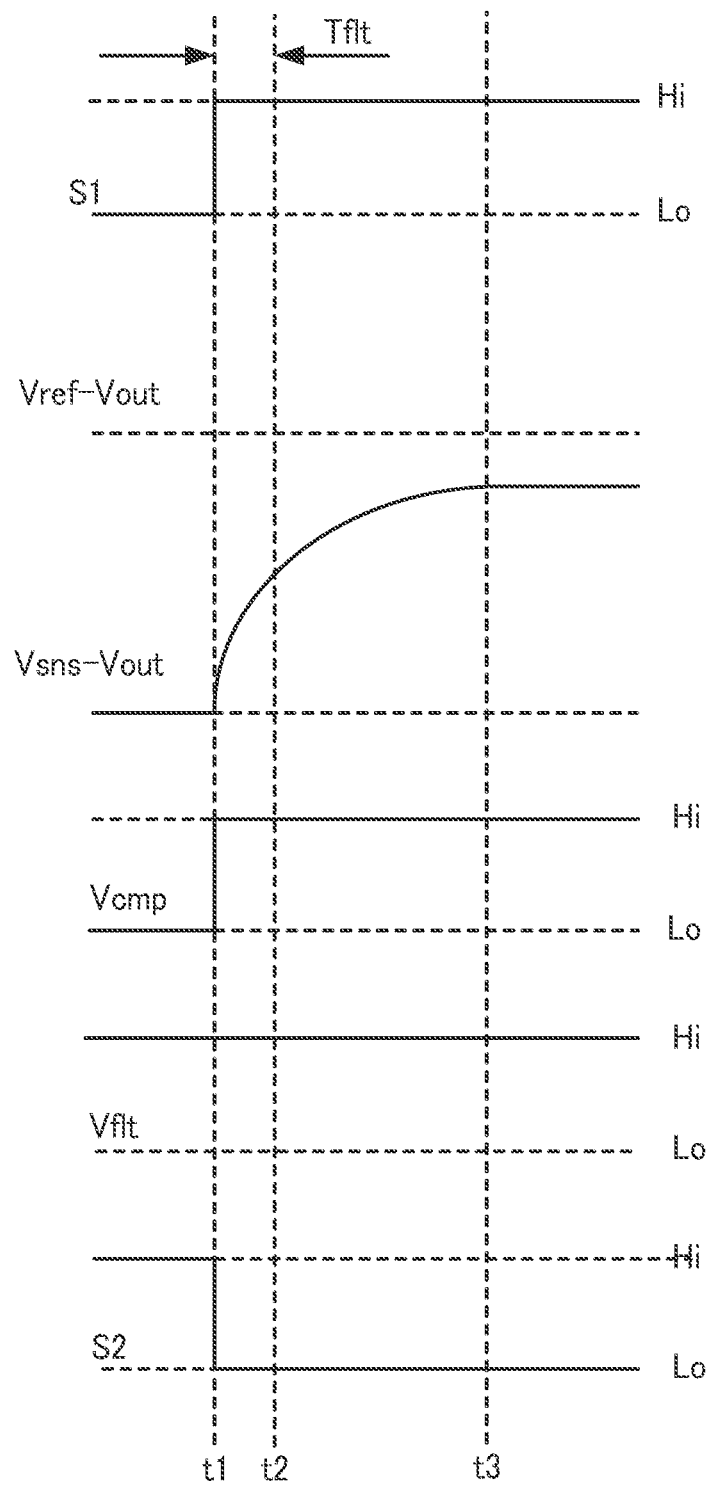
FIG. 4 illustrates a schematic example of changes over time in voltages and signals in a semiconductor module 10 during normal operation.

FIG. 4 illustrates a schematic example of changes over time in voltages and signals in the semiconductor module 10 during normal operation. Herein, "normal operation" of the semiconductor module 10 refers to a case where the semiconductor module 10 operates with the switching device 23 not being in an overcurrent state and the voltage Vout in a range higher than the voltage Vgnd.

FIG. 4 schematically illustrates the voltages and the signals, where Lo represents a state in which the logic level is low (Lo) and Hi represents a state in which the logic level is high (Hi).

At time t1, the microcomputer 11 changes the signal S1 to be input to the terminal SIN from low to high, to drive the switching device 23. Further, the microcomputer 11 maintains the changed signal S1 at high level, to continue driving the switching device 23.

Upon turning on of the switching device 23, the switching device 24 is also turned on. This increases the drain-source current Isns in the switching device 24. With an increase in the drain-source current Isns in the switching device 24, the voltage Vsns generated across the resistor 25 rises as well.

Furthermore, at time t3, the voltage Vsns indicates a steady-state value. In an embodiment of the present disclosure, since the semiconductor module 10 is in normal operation, the voltage Vsns does not reach the reference voltage Vref, at or above which the switching device 23 is brought about an overcurrent state.

The voltage Vsns is input to the line Inm of the comparator circuit 27, and the voltage Vref is input to the line Inp from the reference voltage circuit 26. In an embodiment of the present disclosure, upon tuning on of the switching device 23, the comparator circuit 27 outputs a high voltage Vcmp in the case where the semiconductor module 10 is in normal operation.

Note that the comparator circuit 27 is provided between the lines L1 and L2. Thus, the voltage Vcmp output from the comparator circuit 27 being high means that the voltage Vcmp is equal to the power supply voltage Vdd. On the other hand, when the voltage Vcmp being low means that the voltage Vcmp is equal to the voltage Vgnd.

Note that, with respect to the voltage Vcmp, the low voltage Vcmp corresponds to a "fifth voltage at a first logic level", and the high voltage Vcmp corresponds to a "fifth voltage at a second logic level".

The filter circuit 42 according to an embodiment of the present disclosure is coupled to the terminal SIN, to thereby receive the signal S1. In addition, the filter circuit 42 receives the voltage Vcmp.

In a time period before time t1, the voltage of the line Inp input to the comparator circuit 27 from the reference voltage circuit 26 is low. Also, in this time period, the switching device 24 is not turned on, and thus the voltage generated at the resistor 25 is also low and the voltage Vsns input to the line Inm of the comparator circuit 27 is low as well. In this case, the comparator circuit 27 according to an embodiment of the present disclosure outputs the low voltage Vcmp.

On the other hand, in a time period after time t1, the voltage Vref is applied to the line Inp of the comparator circuit 27 from the reference voltage circuit 26. The semiconductor module 10 according to an embodiment of the present disclosure is in normal operation, such that the voltage Vout generated at the terminal VO does not reach the voltage Vref. Thus, in the time period after time t1, the comparator circuit 27 outputs the high voltage Vcmp.

In response to the signal S1 changing from low to high at time t1, the filter circuit 42 masks the voltage Vcmp output from the comparator circuit 27 during a time period from time t1 to time t2 at which the time period Tflt has elapsed.

Specifically, the filter circuit 42 outputs the high voltage Vflt to the control circuit 41 from time t1 to time t2 irrespective of the logic level of the voltage Vcmp. Thus, the logic level of the voltage Vcmp is masked with respect to the control circuit 41 from time t1 to time t2. In a time period after time t2, the filter circuit 42 outputs the voltage Vflt at the same logic level as that of the voltage Vcmp. In the time period before time t1, the filter circuit 42 outputs the high voltage Vflt in response to the low signal S1.

Note that an overcurrent of the semiconductor module 10 is detected by using the voltage Vsns corresponding to the current Isns flowing through the switching device 24, whose rise time is shorter than that of the switching device 23. Thus, the time period Tflt is set to a short time (e.g., 10 μsec).

The signal S1 is input to the control circuit 41 from the microcomputer 11 through the terminal SIN. In the time period before time t1, the low signal S1 is input to the control circuit 41, to turn off the switching device 23. In response to the low signal S1, the control circuit 41 outputs the high signal S2. While the signal S2 is high, the boost circuit 32 does not boost the power supply voltage Vdd and the interrupting device 33 is on.

In response to the signal S1 input to the control circuit 41 going high at time t1 to turn on the switching device 23, the control circuit 41 outputs the signal S2 changed from high to low. In response to the signal S2 going low, the boost circuit 32 boosts the power supply voltage Vdd to thereby start generating the driving voltage Vdrv, and applies the resultant voltage to the switching device 23. In addition, the interrupting device 33 is turned off.

In an embodiment of the present disclosure, the semiconductor module 10 is in normal operation, and an overcurrent state is not detected. Thus, in the time period after time t1, the control circuit 41 continues outputting the low signal S2 to maintain the switching device 23 in the on state.

<<Timing Chart During Overcurrent Detection>>

Figure 5:
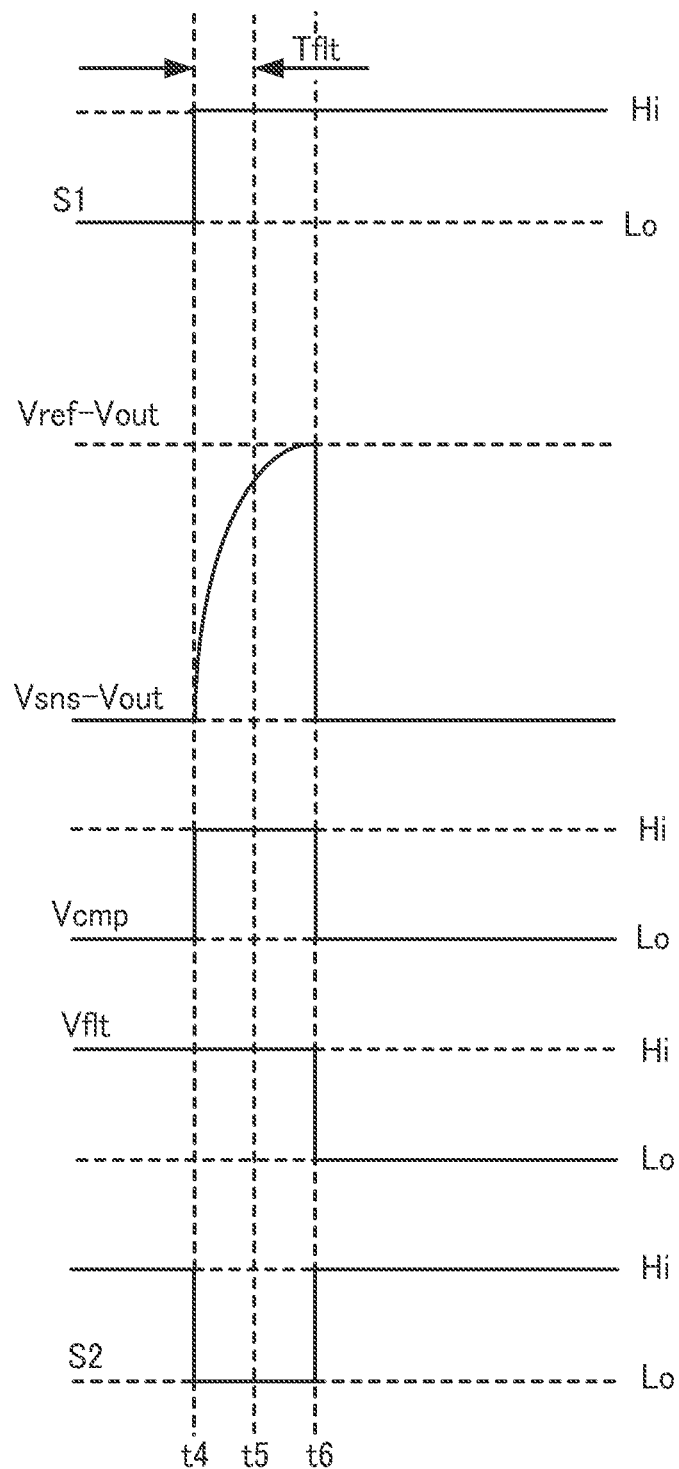
FIG. 5 illustrates a schematic example of changes over time in voltages and signals in a semiconductor module 10 during overcurrent detection.

FIG. 5 illustrates a schematic example of changes over time in voltages and signals in the semiconductor module 10 during overcurrent detection.

At time t4, similarly to the normal operation, the microcomputer 11 changes the signal S1 from low to high, to drive the switching device 23. Further, the microcomputer 11 maintains the changed signal S1 at high level, to continue driving the switching device 23.

At time t4, the switching devices 23 and 24 are turned on. The currents Ids and Isns in the switching devices 23 and 24 increase. In an embodiment of the present disclosure, the voltage Vsns rises with an increase in the current Isns, and in response to the voltage Vsns reaching the reference voltage Vref at time t6, the comparator circuit 27 determines that the switching device 23 is in an overcurrent state.

In response to the comparator circuit 27 detecting the overcurrent state of the switching device 23, the driver circuit 22 turns off the switching device 23. In this case, the switching device 24 is also turned off in association with turning off of the switching device 23. Accordingly, the voltage Vsns generated across the resistor 25 drops after reaching the reference voltage Vref.

In an embodiment of the present disclosure, the driver circuit 22 turns off the switching device 23 to be off for a predetermined time period from time t6, to protect the switching device 23 from the overcurrent state. In association therewith, the switching device 24 is also turned off, and the voltage Vsns generated across the resistor 25 drops to and is maintained at the value corresponding to the voltage Vout.

In a time period before time t4, both the voltage supplied to the line Inp from the reference voltage circuit 26 and the voltage supplied to the line Inm are low. In this case, the comparator circuit 27 outputs the low voltage Vcmp.

In the time period from time t4 to time t6, the voltage Vref is supplied to the line Inp from the reference voltage circuit as well as the voltage Vsns generated across the resistor 25 is supplied to the line Inm, and the voltage Vsns results in being lower than the reference voltage Vref. In this case, the comparator circuit 27 outputs the high voltage Vcmp to the filter circuit 42.

On the other hand, at time t6, the voltage Vsns reaches the reference voltage Vref, and the comparator circuit 27 determines that the switching device 23 has been brought about an overcurrent state. This causes the comparator circuit 27 to output the low voltage Vcmp to the filter circuit 42. Moreover, the comparator circuit 27 continues outputting the low voltage Vcmp for a predetermined time period from time t6.

In the time period before time t4, the filter circuit 42 outputs the high voltage Vflt in response to the low signal S1 input thereto.

In the time period Tflt from time t4 to time t5, the filter circuit 42 outputs the high voltage Vflt irrespective of the logic level of the voltage Vcmp. Thus, the logic level of the voltage Vcmp is masked with respect to the control circuit 41.

In an embodiment of the present disclosure, the comparator circuit 27 outputs the high voltage Vcmp in the time period Tflt from time t4 to time t5. Even if the circuit operation inside the semiconductor module 10 is unstable and the comparator circuit 27 outputs the low voltage Vcmp in the time period from time t4 to time t5, the filter circuit 42 outputs the high voltage Vflt during this time period.

On the other hand, after time t5, the filter circuit 42 outputs the voltage Vflt at the same logic level as that of the voltage Vcmp to the control circuit 41.

Accordingly, in an embodiment of the present disclosure, the filter circuit 42 outputs the high voltage Vflt in the time period before time t4 and the time period from time t4 to time t6. The filter circuit 42 outputs the low voltage Vflt in a predetermined time period from time t6.

In the time period before time t4, the low signal S1 is input to the control circuit 41, to turn off the switching device 23. In response to the low signal S1, the control circuit 41 outputs the high signal S2. While the signal S2 is high, the boost circuit 32 does not boost the power supply voltage Vdd and the interrupting device 33 is on.

In response to the signal S1 going high at time t4 to turn on the switching device 23, the control circuit 41 outputs the signal S2 changed from high to low. In response to the signal S2 going low, the boost circuit 32 boosts the power supply voltage Vdd to thereby start generating the driving voltage Vdrv, and applies the resultant voltage to the switching device 23. In addition, the interrupting device 33 is turned off.

On the other hand, at time t6, the filter circuit 42 inputs the low voltage Vflt to the control circuit 41. This low voltage Vflt indicates, to the control circuit 41, that the switching device 23 has brought about an overcurrent state.

Accordingly, in the time period after time t6, the control circuit 41 outputs the high signal S2 in response to the low voltage Vflt input from the filter circuit 42. In response to the signal S2 going high, the boost circuit 32 stops boosting the power supply voltage Vdd, and the interrupting device 33 is turned on, to thereby turn off the switching device 23.

<<Relationships Between Voltages and Current in Time Period after Lapse of Time Period Tflt in Embodiment 1>>

Figure 6A:
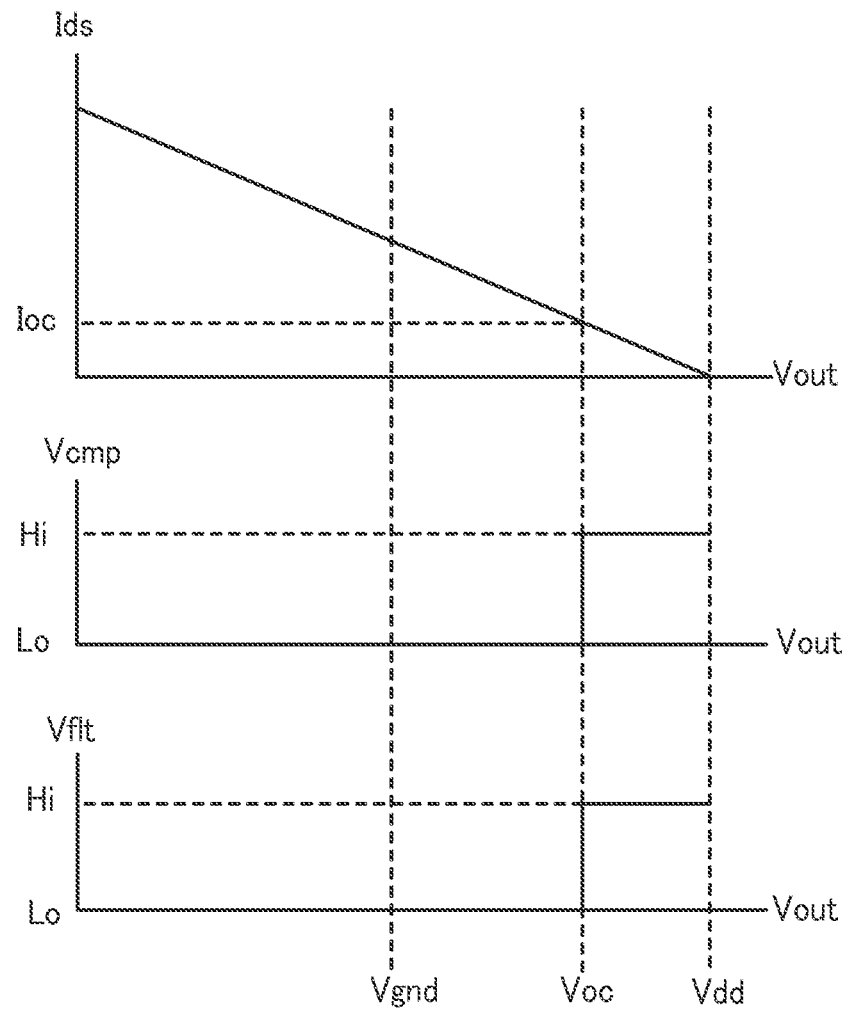
FIG. 6A illustrates a schematic example of a voltage Vout at a terminal VO, a current Ids, and a voltage Vcmp output from a comparator circuit 27.

FIG. 6A illustrates a schematic example of the voltage Vout at the terminal VO, the current Ids, and the voltage Vcmp output from the comparator circuit 27. FIG. 6A illustrates a graph representing a state where the switching device 23 is on in a time period from when the signal S1 has changed from low to high to when the time period Tflt has elapsed.

A relationship between the voltage Vout and the current Ids is illustrated. In the case where the semiconductor module 10 is in normal operation, the voltage Vout applied to the terminal VO indicates the power supply voltage Vdd when the switching device 23 is on.

In the graph presented, when the drain-source current Ids of the switching device 23 reaches a current Ioc indicating an overcurrent state (e.g., 2 A), the voltage Vout applied to the terminal VO reaches a voltage Voc indicating an overcurrent.

In an embodiment of the present disclosure, when the voltage Vout applied to the terminal VO reaches the voltage Voc, the voltage Vsns generated across the resistor 25 reaches the reference voltage Vref output by the reference voltage circuit 26. In other words, the semiconductor module 10 is in normal operation when the voltage Vout applied to the terminal VO is in a range higher than the voltage Voc and equal to or lower than the power supply voltage Vdd.

The comparator circuit 27 outputs the high voltage Vcmp when the voltage Vout is in a range higher than the voltage Voc and lower than the power supply voltage Vdd, that is, when the voltage Vsns is in a range lower than the reference voltage Vref. On the other hand, the comparator circuit 27 outputs the low voltage Vcmp when the voltage Vout is in a range lower than the voltage Voc, that is, when the voltage Vsns is in a range higher than the reference voltage Vref.

The voltage Vflt indicates the same logic level as that of the voltage Vcmp.

<<Logic Level of Voltage in Embodiment 1>>

FIG. 6B illustrates an example of the voltage Vcmp output from the comparator circuit 27 in operating states of the comparator circuit 27. FIG. 6B illustrates a table giving the voltage Vcmp in the time period from when the signal S1 has changed from low to high to when the time period Tflt has elapsed.

When the semiconductor module 10 is in normal operation, the comparator circuit 27 outputs the high voltage Vcmp. In other words, when the voltage Vsns is lower than the reference voltage Vref, the comparator circuit 27 outputs the high voltage Vcmp.

On the other hand, when the voltage Vsns is higher than the reference voltage Vref, the comparator circuit 27 determines that the switching device 23 is in an overcurrent state. In other words, when the voltage Vsns is higher than the reference voltage Vref, the comparator circuit 27 outputs the low voltage Vcmp.

The comparator circuit 27 may fail to operate outside the common mode input range. In order for the comparator circuit 27 according to an embodiment of the present disclosure to be able to output the low voltage Vcmp even in such a case, the reference voltage circuit 26 is coupled to the line Inp, and a node between the switching device 24 and the resistor 25 is coupled to the line Inm.

Accordingly, the comparator circuit 27 outputs the low voltage Vcmp when the voltage Vout is lower than the voltage Vgnd. That is, the comparator circuit 27 determines that the switching device 23 is in an overcurrent state when the voltage Vout is lower than the voltage Vgnd. The driver circuit 22 drives the switching device 23 based on the voltage Vcmp input from the comparator circuit 27.

Embodiment 2

<<Configuration of Semiconductor Module 20>>

Figure 7:
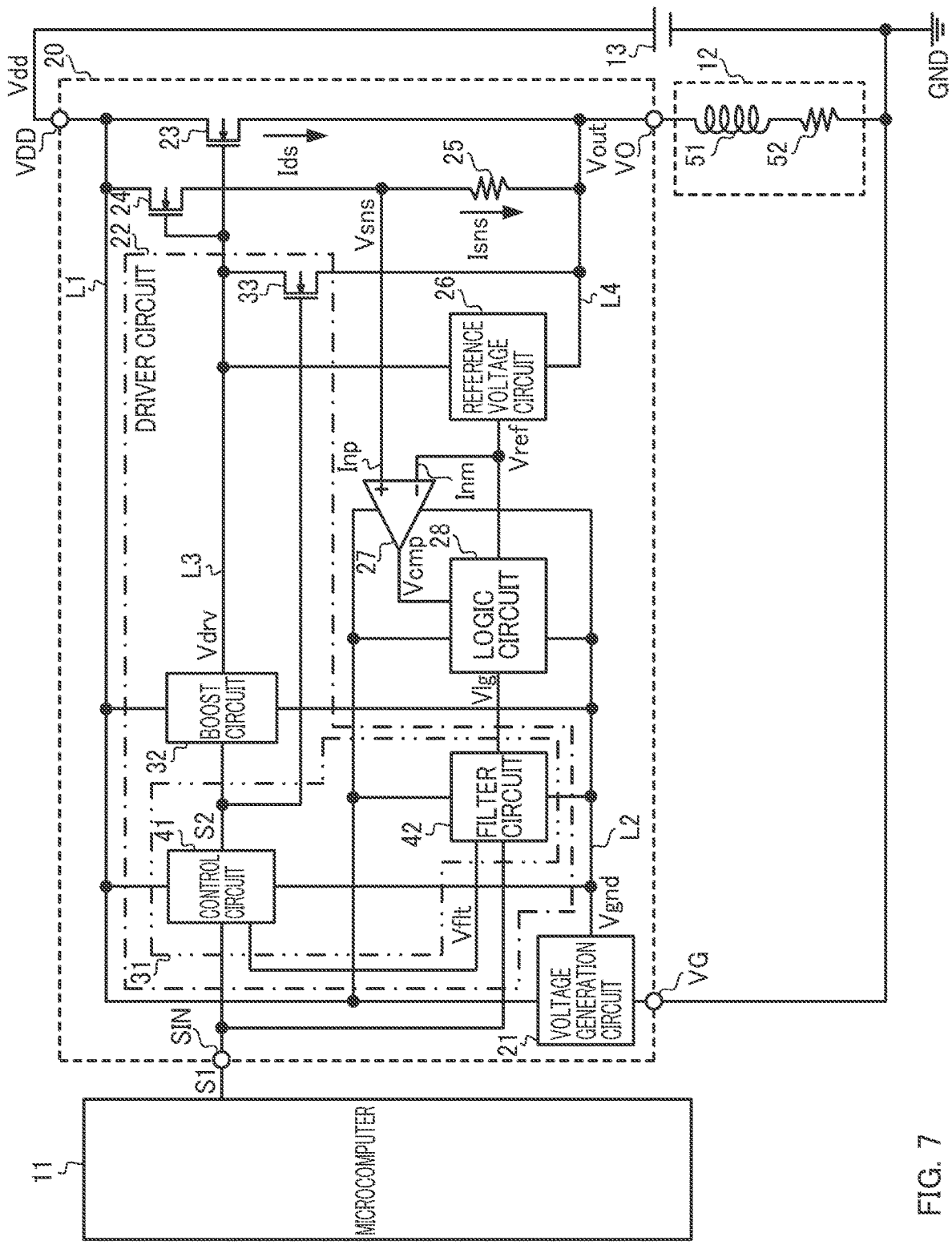
FIG. 7 illustrates an example of a configuration of a semiconductor module 20.

FIG. 7 illustrates an example of a configuration of a semiconductor module 20. A description will be given below mainly focusing on features of the configuration of the semiconductor module 20 that are different from those of the semiconductor module 10. Note that the elements of the semiconductor module 20 denoted by the same reference numerals as those of the semiconductor module 10 have similar configurations.

The semiconductor module 20 differs from the semiconductor module 10 in how the reference voltage circuit 26 and the comparator circuit 27 are coupled. Moreover, the semiconductor module 20 includes a logic circuit 28 coupled to the reference voltage circuit 26, the comparator circuit 27, and the filter circuit 42.

In the semiconductor module 20, the voltage Vref supplied from the reference voltage circuit 26 is input to the line Inm, to which the inverting input terminal of the comparator circuit 27 is coupled. On the other hand, the voltage Vsns generated at the node between the switching device 24 and the resistor 25 is input to the line Inp coupled to the non-inverting input terminal of the comparator circuit 27.

In other words, the inputs to the lines Inp and Inm in the semiconductor module 20 are the reverse of the inputs to the lines Inp and Inm in the semiconductor module 10. As a result, the logic level of the voltage Vcmp output from the comparator circuit 27 is different between the semiconductor modules 10 and 20.

<<Logic Circuit 28>>

The logic circuit 28 outputs a voltage Vlg to the filter circuit 42. In an embodiment of the present disclosure, the filter circuit 42 supplies the voltage Vflt to the control circuit 41 according to the voltage Vlg.

The voltage Vflt becomes low logic level in response to the low signal S1. Moreover, the voltage Vflt is at the logic level indicating that the switching device 23 is not in an overcurrent state (low level) irrespective of the voltage Vlg prior to when the time period Tflt has elapsed from when the signal S1 goes high. Furthermore, the voltage Vflt becomes the same logic level as that of the voltage Vcmp input from the comparator circuit 27, in response to the time period Tflt having elapsed since the signal S1 goes high. Note that, in the semiconductor module 20, unlike the semiconductor module 10, the logic level of the voltage Vflt indicating that the switching device 23 is not in an overcurrent state is low.

In an embodiment of the present disclosure, the logic circuit 28 is coupled to the control circuit 41 through the filter circuit 42. Thus, by operating based on the voltage Vflt, the control circuit 41 can operate indirectly based on the voltage Vlg without coupling the logic circuit 28 to the control circuit 41.

====Embodiment in which Logic Circuit 28 has Partly Modified Coupling Relationship====

In another embodiment of the semiconductor module 20, the logic circuit 28 is coupled to the control circuit 41 without the filter circuit 42 interposed therebetween. In particular, in an embodiment in which the control circuit 41 is separately coupled to the logic circuit 28 and to the filter circuit 42, the control circuit 41 uses the high voltage Vflt output by the filter circuit 42 in priority to the voltage Vlg output by the logic circuit 28 and, when the voltage Vflt is high, outputs the signal S2 in response to the signal S1 irrespective of the logic level of the voltage Vlg.

===Control Circuit 41 in Semiconductor Module 20===

In the semiconductor module 20 as well, the control circuit 41 outputs the signal S2 in response to the signal S1 from the microcomputer 11 and the voltage Vflt. However, there is a difference, from an embodiment of the semiconductor module 10, in the logic level of the voltage Vflt input to the control circuit 41 when the comparator circuit 27 determines that the switching device 23 is in an overcurrent state.

Accordingly, in this embodiment of the present disclosure, when the voltage Vflt input from the filter circuit 42 is low and the signal S1 is low, the control circuit 41 outputs the high signal S2 in response to the low signal S1. On the other hand, the control circuit 41 outputs the low signal S2 when the voltage Vflt input from the filter circuit 42 is low and the signal S1 is high.

In addition, the control circuit 41 according to an embodiment of the present disclosure outputs the high signal S2 when the voltage Vflt input from the filter circuit is high.

Note that, in the semiconductor module 20, the voltage Vlg corresponds to a "sixth voltage".

<<Configuration of Logic Circuit 28>>

Figure 8:
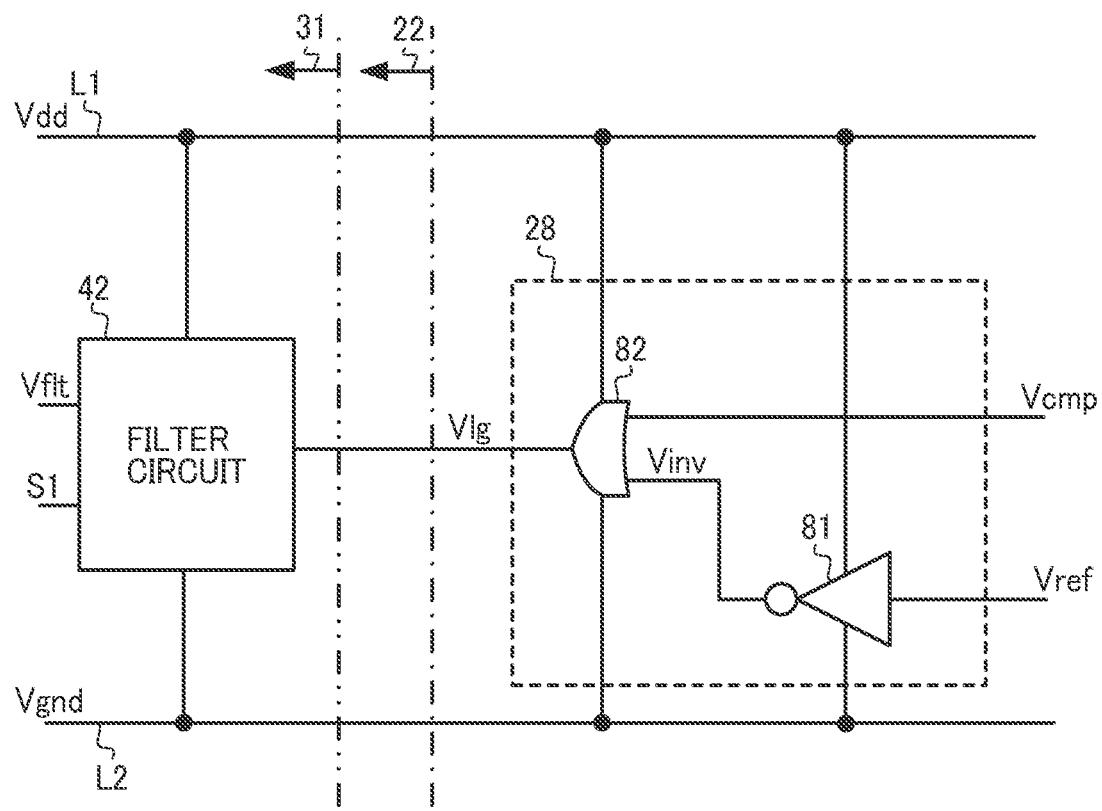
FIG. 8 illustrates a configuration of a logic circuit 28 and a relationship between a logic circuit 28 and a filter circuit 42.

FIG. 8 illustrates a configuration of the logic circuit 28 and a relationship between the logic circuit 28 and the filter circuit 42. The logic circuit 28 includes an inverting circuit 81 and an OR circuit 82.

The inverting circuit 81 outputs a voltage Vinv at a logic level that varies depending on whether the reference voltage Vref input from the reference voltage circuit 26 is higher than a predetermined threshold voltage. When the voltage Vout drops below the voltage Vgnd, the reference voltage Vref drops as well.

The inverting circuit 81 according to an embodiment of the present disclosure outputs a high voltage Vinv when the voltage Vref is lower than the predetermined threshold voltage. On the other hand, the inverting circuit 81 according to an embodiment of the present disclosure outputs a low voltage Vinv when the voltage Vref is higher than the predetermined threshold voltage.

Note that the threshold voltage with respect to the voltage Vref, based on which the inverting circuit 81 changes the logic level of the voltage Vinv from low to high, is set at least at a voltage equal to or higher than the voltage at which the voltage Vout drops to the voltage Vgnd. Specifically, the inverting circuit 81 is designed so as to output the high voltage Vinv at least in a range in which the voltage Vout drops below the voltage Vgnd.

The inverting circuit 81 is coupled to the reference voltage circuit 26. Moreover, the inverting circuit 81 is coupled to the lines L1 and L2, so as to operate, with the power supply voltage Vdd applied to the line L1 and the voltage Vgnd applied to the line L2 serving as bias voltages.

The OR circuit 82 outputs a high voltage Vlg when either the voltages Vcmp or Vinv input thereto is at a high logic level. On the other hand, when both the voltages Vcmp and Vinv are low, the OR circuit 82 outputs the low voltage Vlg.

The OR circuit 82 is coupled to the comparator circuit 27 and the inverting circuit 81. Moreover, the OR circuit 82 is coupled to the lines L1 and L2, so as to operates, with the power supply voltage Vdd applied to the line L1 and the voltage Vgnd applied to the line L2 serving as bias voltages.

The voltage Vlg output from the OR circuit 82 is input to the driver circuit 22. The voltage Vlg is used for the driver circuit 22 to control the driving of the switching device 23. In an embodiment of the present disclosure, the voltage Vlg is input to the filter circuit 42.

However, the circuit to receive the voltage Vlg is not limited to the filter circuit 42, as long as an overcurrent state is controlled when the voltage Vlg is high. Accordingly, in other embodiments of the semiconductor module 20, the voltage Vlg may be input to the control circuit 41 without passing through the filter circuit 42.

Note that, with respect to the voltage Vlg, the high voltage Vlg corresponds to a "sixth voltage at a first logic level", and the low voltage Vlg corresponds to a "sixth voltage at a second logic level".

<<Relationships Between Voltages and Current in Time Period after Lapse of Time Period Tflt in Embodiment 2>>

Figure 9A:
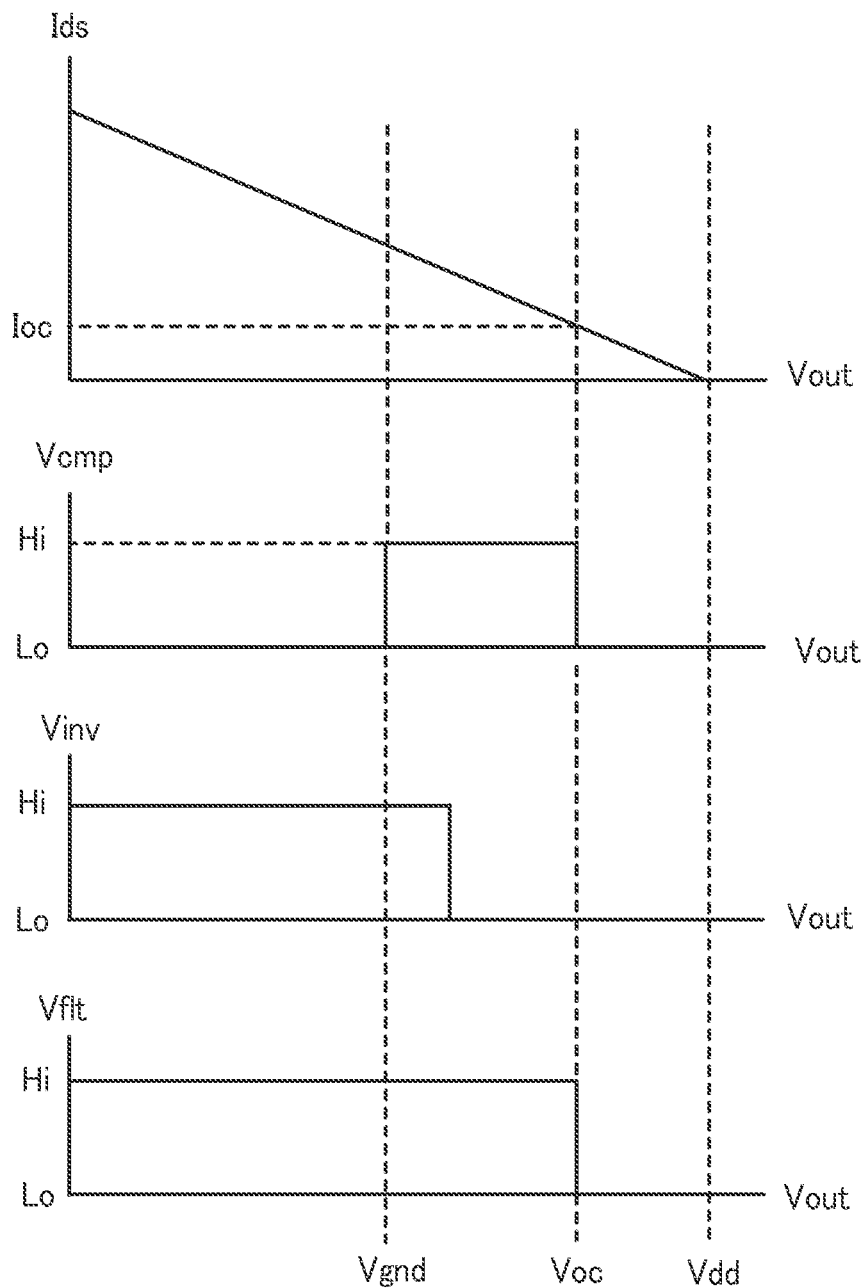
FIG. 9A illustrates a schematic example of a voltage Vout at a terminal VO, a current Ids, and a voltage Vcmp output from a comparator circuit 27.

FIG. 9A illustrates a schematic example of the voltage Vout at the terminal VO, the current Ids, and the voltage Vcmp output from the comparator circuit 27. FIG. 9A illustrates a graph of a current and voltages in the semiconductor module 20 corresponding to FIG. 6A. FIG. 9A illustrates a graph representing a state where the switching device 23 is on in a time period from when the signal S1 has changed to high to when the time period Tflt has elapsed.

A relationship between the voltage Vout and the current Ids is illustrated. In the case where the semiconductor module 10 is in normal operation and when the switching device 23 is on, the voltage Vout applied to the terminal VO indicates the power supply voltage Vdd.

In the graph presented, when the drain-source current Ids of the switching device 23 reaches the current Ioc indicating an overcurrent state (e.g., 2 A), the voltage Vout applied to the terminal VO reaches the voltage Voc indicating an overcurrent.

In an embodiment of the present disclosure, when the voltage Vout applied to the terminal VO reaches the voltage Voc, the voltage Vsns generated across the resistor 25 reaches the reference voltage Vref. In other words, the semiconductor module 20 is in normal operation when the voltage Vout applied to the terminal VO is in a range higher than the voltage Voc and equal to or lower than the power supply voltage Vdd.

In the semiconductor module 20, unlike the semiconductor module 10, the comparator circuit 27 outputs the low voltage Vcmp when the voltage Vout is in a range higher than the voltage Voc and lower than the power supply voltage Vdd, that is, when the voltage Vsns is in a range lower than the reference voltage Vref. On the other hand, the comparator circuit 27 outputs the high voltage Vcmp when the voltage Vout is in a range lower than the voltage Voc, that is, when the voltage Vsns is in a range higher than the reference voltage Vref.

Further, in an embodiment of the present disclosure, the comparator circuit 27 may output the low logic level, when the voltage Vout drops and both the reference voltage Vref and the voltage Vsns drop such that the voltages input to the comparator circuit 27 fall outside the common mode input range.

In the semiconductor module 20, the inverting circuit 81 outputs the high voltage Vinv when the voltage Vout is lower than the voltage Vgnd. Accordingly, the inverting circuit 81 changes the logic level of the voltage Vinv to be output therefrom from low to high, based on a voltage equal to or higher than such a voltage that the comparator circuit 27 falls outside the common mode input range and lower than such a voltage that the voltage Vout reaches the voltage Voc.

In practice, the inverting circuit 81 compares the reference voltage Vref with a predetermined threshold voltage and, when the reference voltage Vref is lower than this threshold voltage, changes the logic level of the voltage Vinv. Specifically, the threshold voltage is set such that the inverting circuit 81 changes the logic level of the voltage Vinv from low to high when the voltage Vout is a voltage in a range higher than the voltage Vgnd and lower than the voltage Voc.

As a result, when the voltage Vout is lower than the voltage Voc, either the voltage Vcmp output by the comparator circuit 27 or the voltage Vinv output by the inverting circuit 81 is high. Since the OR circuit 82 receives the voltage Vcmp and the voltage Vinv, the OR circuit 82 outputs the high voltage Vlg when the voltage Vout is lower than the voltage Voc.

The filter circuit 42 outputs the voltage Vflt at the same logic level as that of the voltage Vlg in the time period from when the signal S1 has changed from low to high to when the time period Tflt has elapsed. Thus, the filter circuit 42 outputs the high voltage Vflt when the voltage Vout is lower than the voltage Voc.

<<Logic Levels of Voltages in Embodiment 2>>

FIG. 9B illustrates an example of the voltage Vcmp output from the comparator circuit 27 and the voltage Vlg output from the logic circuit 28 in operating states of the comparator circuit 27. FIG. 9B illustrates a table giving the voltages Vcmp, Vinv, and Vlg in the time period from when the signal S1 has changed from low to high to when the time period Tflt has elapsed.

In contrast to the comparator circuit 27 in the semiconductor module 10 outputting the high voltage Vcmp during normal operation of the semiconductor module 10, the comparator circuit 27 in the semiconductor module 20 outputs the low voltage Vcmp during normal operation of the semiconductor module 20. This is because the voltages applied to the lines Inp and Inm input to the comparator circuit 27 are different between the semiconductor modules 10 and 20.

The comparator circuit 27 outputs the high voltage Vcmp to the logic circuit 28 when the voltage Vsns is higher than the reference voltage Vref. On the other hand, the comparator circuit 27 outputs the low voltage Vcmp to the logic circuit 28 when the voltage Vsns is lower than the reference voltage Vref. Further, the comparator circuit 27 outputs the low voltage Vcmp to the logic circuit 28 when the voltage Vout is lower than the voltage Vgnd.

The inverting circuit 81 outputs the high voltage Vinv when the voltage Vout is lower than the voltage Vgnd. Accordingly, the OR circuit 82 outputs the high voltage Vlg when the voltage Vout is lower than the voltage Vgnd or when the voltage Vsns is higher than the reference voltage Vref. In this case, the driver circuit 22 drives the switching device 23 based on the voltage Vlg.

As such, in the semiconductor module 20, the voltage Vsns or Vref is input to the comparator circuit 27 or the logic circuit 28. This makes it possible to protect the circuit from the overcurrent state of the switching device 23 when the voltage Vout drops below the voltage Vgnd, without the voltage Vout being input to the comparator circuit 27 or the logic circuit 28.

SUMMARY

The semiconductor modules 10 and 20 according to embodiments of the present disclosure have been described.

An embodiment of the present disclosure provides the semiconductor module 10 including: the switching device 23 coupled to the line L1 configured to receive the power supply voltage Vdd; the terminal VO at which the voltage Vout corresponding to the current Ids flowing through the switching device 23 is generated while the switching device 23 is on, the terminal VO being coupled to the switching device 23; the switching device 24 through which the current Isns corresponding to the current Ids flows, the switching device 24 being coupled to the line L1; the voltage generation circuit 21 configured to apply, to the line L2, the voltage Vgnd that is lower than the power supply voltage Vdd by a predetermined voltage; the resistor 25 across which the voltage Vsns corresponding to the current Isns is generated, the resistor 25 being coupled between the switching device 24 and the terminal VO; the reference voltage circuit 26 coupled to the terminal VO, the reference voltage circuit 26 being configured to generate the reference voltage Vref; and the comparator circuit 27 coupled between the lines L1 and L2, the comparator circuit 27 being configured to determine whether the switching device 23 is in an overcurrent state based on a comparison between the voltage Vsns and the reference voltage Vref.

This enables the semiconductor modules 10 and 20 according to embodiments of the present disclosure to appropriately protect the circuit from an overcurrent in both cases: (i) in which an overcurrent flows through the load 12; and (ii) in which a path parallel to the load 12 is short-circuited between the terminal VO and the ground due to a circuit defect, dirt, and/or the like, resulting in an overcurrent flowing in the direction of the ground through a path other than the load 12.

Further, the semiconductor modules 10 and 20 each include the driver circuit 22 configured to turn on and off the switching device 23 in response to the input signal S1, and the driver circuit 22 turns off the switching device 23 in response to the comparator circuit 27 determining that the switching device is in an overcurrent state.

This enables the switching device 23 to be turned off when it is in an overcurrent state, thereby being able to protect the semiconductor modules 10 and 20 and systems coupled to the semiconductor modules 10 and 20 from the overcurrent state.

Further, the comparator circuit 27 according to Embodiment 1 determines that the switching device 23 is in an overcurrent state when the voltage Vout is lower than the voltage Vgnd.

In other words, the comparator circuit 27 according to Embodiment 1 outputs the same logic as that when the switching device 23 is brought about an overcurrent state, in the case where the voltage Vout is lower than the voltage Vgnd. This enables the semiconductor module 10 to appropriately protect the system from an overcurrent in the case where a path parallel to the load 12 is short-circuited between the terminal VO and the ground due to a circuit defect, dirt, and/or the like, resulting in an overcurrent flowing in the direction of the ground through a path other than the load 12.

Moreover, the comparator circuit 27 according to an embodiment of the present disclosure is capable of detecting an overcurrent state without using a device having a large circuit area, such as a rail-to-rail input comparator. Accordingly, the configuration of the semiconductor module 10 contributes to reduction in the circuit area as well.

Further, the comparator circuit 27 outputs the high voltage Vcmp when the voltage Vsns is lower than the reference voltage Vref, and outputs the low voltage Vcmp when the voltage Vout is lower than the voltage Vgnd or when the voltage Vsns is higher than the reference voltage Vref, and the driver circuit 22 drives the switching device 23 based on the voltage Vcmp.

As has been described above, it is specifically indicated what logic level the comparator circuit 27 outputs according to the input voltages. Further, since the comparator circuit 27 outputs such a logic level, the comparator circuit 27 receiving the voltages Vsns and Vref enables the semiconductor module 10 to protect the circuit from the overcurrent state of the switching device 23 when the voltage Vout drops below the voltage Vgnd, without inputting the voltage Vout to the comparator circuit 27.

The semiconductor module 20 according to Embodiment 2 includes the logic circuit 28 coupled to the comparator circuit 27, the comparator circuit 27 outputs the high voltage Vcmp to the logic circuit 28 when the voltage Vsns is higher than the reference voltage Vref, and outputs the low voltage Vcmp to the logic circuit 28 when the voltage Vsns is lower than the reference voltage Vref, the logic circuit 28 outputs the high voltage Vlg when the voltage Vout is lower than the voltage Vgnd or when the voltage Vsns is higher than the reference voltage Vref, and the driver circuit 22 drives the switching device 23 based on the voltage Vlg.

This enables the semiconductor module 20 to appropriately protect the system from an overcurrent in the case where a path parallel to the load 12 is short-circuited between the terminal VO and the ground due to a circuit defect, dirt, and/or the like, resulting in an overcurrent flowing in the direction of the ground through a path other than the load 12.

Further, the logic circuit 28 is coupled to the reference voltage circuit 26 and the comparator circuit 27.

Thus, in the semiconductor module 20, with the voltage Vsns or Vref being input to the comparator circuit 27 or the logic circuit 28, it is possible to protect the circuit from the overcurrent state of the switching device 23 when the voltage Vout drops below the voltage Vgnd, without inputting the voltage Vout to the comparator circuit 27 or the logic circuit 28.

Further, the logic circuit 28 includes the inverting circuit 81 coupled to the reference voltage circuit 26, and the OR circuit 82 coupled to the comparator circuit 27 and the inverting circuit 81.

Thus, the logic circuit 28 results in a circuit that outputs the high voltage Vlg when the voltage Vout is lower than the voltage Vgnd or when the voltage Vsns is higher than the reference voltage Vref.

Further, in the semiconductor modules 10 and 20, the driver circuit 22 includes: the control signal output circuit 31 configured to output the signal S2 that is based on the input signal S1 for controlling the on and off of the switching device 23, irrespective of the result of the comparison by the comparator circuit 27, in the predetermined time period Tflt when the switching device 23 is turned on, and outputs the signal S2 that is based on the input signal S1 and the result of the comparison after a lapse of the predetermined time period Tflt; the boost circuit 32 configured to apply the driving voltage Vdrv to the control electrode of the switching device 23 in response to the signal S2 upon turning on of the switching device; and the interrupting device 33 configured to turn off the switching device 23, in response to the signal S2 to turn off the switching device 23.

This makes it possible to configure an IPS having a function of being able to appropriately protect the circuit from an overcurrent in both cases: (i) in which an overcurrent flows through the load 12; and (ii) in which a path parallel to the load 12 is short-circuited between the terminal VO and the ground due to a circuit defect, dirt, and/or the like, resulting in an overcurrent flowing in the direction of the ground through a path other than the load 12.

The present disclosure is directed to provision of a semiconductor module capable of appropriately detecting an overcurrent state caused by short-circuit of a load and/or the like.

It is possible to provide a semiconductor module capable of appropriately detecting an overcurrent state caused by short-circuit of a load and/or the like.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

It should be noted that the processes such as the operations, procedures, steps, stages, and the like performed by the device, system, program, and method described in the scope of the claims, description, and figures can be executed in any order, as long as the order is not particularly and clearly indicated by "before," "prior to," and/or the like and, as long as the output from a previous process is not used in a subsequent process. Even if an operation flow is described by using term(s) such as "first", "next", and/or the like for convenience in the scope of the claims, description, and/or figures, this does not necessarily mean that the process must be performed in this order.

What is claimed is:

1. A semiconductor module comprising:
a first switching device coupled to a first line in the semiconductor module, the first line being configured to receive a power supply voltage;
a terminal coupled to the first switching device, a first voltage corresponding to a first current flowing through the first switching device being generated at the terminal while the first switching device is on;
a second switching device coupled to the first line, the second switching device being configured to allow a second current corresponding to the first current to flow therethrough;
a voltage generation circuit configured to apply, to a second line in the semiconductor module, a second voltage that is lower than the power supply voltage by a predetermined voltage;
a resistor coupled between the second switching device and the terminal, a third voltage corresponding to the second current being generated across the resistor;
a reference voltage circuit coupled to the terminal, the reference voltage circuit being configured to generate a fourth voltage; and
a comparator circuit coupled between the first line and the second line, the comparator circuit being configured to determine whether the first switching device is in an overcurrent state based on a comparison between the third voltage and the fourth voltage, wherein
the comparator circuit further determines that the first switching device is in the overcurrent state when the first voltage is lower than the second voltage.

2. The semiconductor module according to claim 1, further comprising
a driver circuit configured to turn on and off the first switching device in response to an input signal of the semiconductor module, wherein
the driver circuit turns off the first switching device in response to the comparator circuit determining that the first switching device is in the overcurrent state.

3. The semiconductor module according to claim 2, wherein
the comparator circuit outputs a fifth voltage that is
at a first logic level when the third voltage is lower than the fourth voltage, and
at a second logic level when the first voltage is lower than the second voltage or when the third voltage is higher than the fourth voltage, and
the driver circuit drives the first switching device based on the fifth voltage.

4. The semiconductor module according to claim 2, wherein the driver circuit includes:
a control signal output circuit configured to
output a control signal that is based on the input signal for controlling on and off of the first switching device, irrespective of a result of the comparison by the comparator circuit, in a predetermined time period when the first switching device is turned on, and output the control signal that is based on the input signal and the result of the comparison after a lapse of the predetermined time period;

a boost circuit configured to apply a driving voltage to a control electrode of the first switching device in response to the control signal upon turning on of the first switching device; and an interrupting device configured to turn off the first switching device, in response to the control signal to turn off the first switching device.

5. A semiconductor module, comprising a first switching device coupled to a first line in the semiconductor module, the first line being configured to receive a power supply voltage;

a terminal coupled to the first switching device, a first voltage corresponding to a first current flowing through the first switching device being generated at the terminal while the first switching device is on;

a second switching device coupled to the first line, the second switching device being configured to allow a second current corresponding to the first current to flow therethrough;

a voltage generation circuit configured to apply, to a second line in the semiconductor module, a second voltage that is lower than the power supply voltage by a predetermined voltage;

a resistor coupled between the second switching device and the terminal, a third voltage corresponding to the second current being generated across the resistor;

a reference voltage circuit coupled to the terminal, the reference voltage circuit being configured to generate a fourth voltage; and a comparator circuit coupled between the first line and the second line, the comparator circuit being configured to determine whether the first switching device is in an overcurrent state based on a comparison between the third voltage and the fourth voltage, a driver circuit configured to turn on and off the first switching device in response to an input signal of the semiconductor module, and a logic circuit coupled to the comparator circuit, wherein the driver circuit turns off the first switching device in response to the comparator circuit determining that the first switching device is in the overcurrent state, and the comparator circuit outputs a fifth voltage to the logic circuit, the fifth voltage being
  at a first logic level when the third voltage is higher than the fourth voltage, and
  at a second logic level when the third voltage is lower than the fourth voltage, the logic circuit outputs a sixth voltage at the first logic level when the first voltage is lower than the second voltage or when the third voltage is higher than the fourth voltage, and the driver circuit drives the first switching device based on the sixth voltage.

6. The semiconductor module according to claim 5, wherein the logic circuit is coupled to the reference voltage circuit and the comparator circuit.

7. The semiconductor module according to claim 5, wherein the logic circuit includes
  an inverting circuit coupled to the reference voltage circuit, and
  an OR circuit coupled to the comparator circuit and the inverting circuit.

* * * * *